United States Patent
Hirano et al.

(12)

(10) Patent No.: US 6,335,841 B1
(45) Date of Patent: Jan. 1, 2002

(54) CODING APPARATUS AND CODING METHOD

(75) Inventors: Akihiko Hirano, Odawara; Seiichi Mita, Shiroyamamachi; Yoshiju Watanabe, Ninomiyamachi, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/502,056

(22) Filed: Feb. 10, 2000

(30) Foreign Application Priority Data

May 20, 1999 (JP) .................................................. 11-139693

(51) Int. Cl.[7] ....................................................... G11B 5/09
(52) U.S. Cl. .................. 360/40; 360/46; 341/50; 341/59
(58) Field of Search .................. 360/40, 46, 65, 360/53; 341/50, 59

(56) References Cited

U.S. PATENT DOCUMENTS 6,081,210 A * 6/2000 Nikolic et al. ................. 341/59
6,130,629 A * 10/2000 Aziz et al. ...................... 341/50

* cited by examiner

*Primary Examiner*—Regina Y. Neal
(74) *Attorney, Agent, or Firm*—Antonelli, Terry, Stout & Kraus, LLP

(57) ABSTRACT

In a coding method which does not restrict a run length of "1" while data is recorded/reproduced, there are such a drawback that when an error correction is carried out, a total number of error data to be corrected is increased, and also errors of not-detectable data are increased. While data is coded, a continuous number of "1" contained in a code word is limited, and then an error correction is carried out inside a coding/decoding process operation. Thus, a recording/reproducing apparatus having a small number of decoding errors is available.

21 Claims, 11 Drawing Sheets

| INPUT | | | OUTPUT | | |
|---|---|---|---|---|---|
| PREV_LSB | PARITY | CURR_MSB | PREV_LSB | PARITY | CURR_MSB |
| 0001 | 1 | 1100 | 0001 | 0 | 1110 |
| 1001 | 1 | 1100 | 1001 | 0 | 1110 |
| 0101 | 1 | 1100 | 0101 | 0 | 1110 |
| 1101 | 1 | 1100 | 0111 | 0 | 1100 |
| 0001 | 1 | 1101 | 0010 | 0 | 1110 |
| 1001 | 1 | 1101 | 0110 | 0 | 1110 |
| 0101 | 1 | 1101 | 0111 | 0 | 0101 |
| 1101 | 1 | 1101 | 1101 | 0 | 1110 |
| 0011 | 1 | 1000 | 0111 | 0 | 1000 |
| 1011 | 1 | 1000 | 0111 | 0 | 0100 |
| 0011 | 1 | 1001 | 0111 | 0 | 1001 |
| 1011 | 1 | 1001 | 0111 | 0 | 0110 |
| 0011 | 1 | 1010 | 0111 | 0 | 1010 |
| 1011 | 1 | 1010 | 1010 | 0 | 1110 |
| 0011 | 1 | 1011 | 0011 | 0 | 1110 |
| 1011 | 1 | 1011 | 0111 | 0 | 1011 |
| 0011 | 1 | 1100 | 0111 | 0 | 0010 |
| 1011 | 1 | 1100 | 1011 | 0 | 1110 |
| 0011 | 1 | 1101 | 0111 | 0 | 1101 |
| 1011 | 1 | 1101 | 0100 | 0 | 1110 |

FIG.6

| INPUT | | | OUTPUT | | |
|---|---|---|---|---|---|
| PREV_LSB | PARITY | CURR_MSB | PREV_LSB | PARITY | CURR_MSB |
| 000000 | 0 | 000000 | 000111 | 0 | 111000 |
| 000000 | 0 | 000001 | 000111 | 0 | 111001 |
| 000000 | 0 | 000010 | 000111 | 0 | 111010 |
| 000000 | 0 | 000011 | 000111 | 0 | 111011 |
| 100000 | 0 | 000000 | 100111 | 0 | 111000 |
| 010000 | 0 | 000000 | 010111 | 0 | 111000 |
| 110000 | 0 | 000000 | 110111 | 0 | 111000 |
| 1000 | 0 | 000000 | 1000 | 0 | 111000 |
| 0100 | 0 | 000000 | 0111 | 0 | 001100 |
| 1100 | 0 | 000000 | 0111 | 0 | 001110 |
| 0010 | 0 | 000000 | 0111 | 0 | 000010 |
| 1010 | 0 | 000000 | 1000 | 0 | 111010 |
| 0110 | 0 | 000000 | 0111 | 0 | 000000 |
| 1110 | 0 | 000000 | 1110 | 0 | 111000 |
| 000000 | 0 | 0001 | 000111 | 0 | 0001 |
| 000000 | 0 | 0010 | 001100 | 0 | 1110 |
| 000000 | 0 | 0011 | 011100 | 0 | 1110 |
| 000000 | 0 | 0100 | 010000 | 0 | 1110 |
| 000000 | 0 | 0101 | 010111 | 0 | 0001 |
| 000000 | 0 | 0110 | 000000 | 0 | 1110 |
| 000000 | 0 | 0111 | 000111 | 0 | 0111 |

FIG.7

| INPUT | | | OUTPUT | | |
|---|---|---|---|---|---|
| PREV_LSB | PARITY | CURR_MSB | PREV_LSB | PARITY | CURR_MSB |
| 001100 | 1 | 100110 | 001110 | 0 | 111010 |
| 100110 | 0 | 110011 | 100111 | 0 | 111011 |
| 110011 | 0 | 011001 | 110111 | 0 | 111001 |
| 011001 | 1 | 001100 | 010111 | 0 | 011100 |

| INPUT | | OUTPUT | |
|---|---|---|---|
| PREV_LSB | CURR_MSB | PREV_LSB | CURR_MSB |
| 0011 | 0011 | 0111 | 0001 |
| 1001 | 1001 | 0111 | 0010 |
| 1100 | 1100 | 1000 | 1110 |
| 0110 | 0110 | 0100 | 1110 |

FIG.16

| INPUT | | | OUTPUT | | |
|---|---|---|---|---|---|
| PREV_LSB | PARITY | CURR_MSB | PREV_LSB | PARITY | CURR_MSB |
| 0011 | 1 | 1100 | 0111 | 0 | 1110 |
| 0011 | 1 | 1101 | 0111 | 0 | 1101 |
| 1011 | 1 | 1100 | 1011 | 0 | 1110 |
| 1011 | 1 | 1101 | 1000 | 0 | 1110 |

FIG.17

| INPUT | | | OUTPUT | | |
|---|---|---|---|---|---|
| PREV_LSB | PARITY | CURR_MSB | PREV_LSB | PARITY | CURR_MSB |
| 0011 | 0 | 0110 | 0111 | 0 | 0110 |
| 1001 | 1 | 0011 | 1001 | 0 | 1110 |
| 1100 | 1 | 1001 | 0111 | 0 | 1001 |
| 0110 | 0 | 1100 | 0110 | 0 | 1110 |

CODING APPARATUS AND CODING METHOD

BACKGROUND OF THE INVENTION

The present invention is related to an apparatus for coding data to record coded data on a recording/reproducing apparatus for reproducing and decoding the recorded data. More specifically, the present invention is directed to a method for coding and decoding data.

To understand the present invention, the conventional technique will be briefly explained. The conventional technique involves explanations about the Viterbi algorithm and trellis representation, the partial response channel, and the error correction.

The Viterbi algorithm is to determine a most likelihood path along branches of a trellis diagram. The respective branches of the trellis diagram are weighted with respect to the values of input signals. The Viterbi algorithm may determine such a path for constituting the most likelihood degree based upon the accumulated value of these weighted values.

A so-called "PRML (Partial Response Maximum Likelihood) system" is widely used in magnetic recording/reproducing apparatuses. In this PRML system, the partial response (PR) channel is combined with this Viterbi algorithm. A system polynomial known as the partial response class 4 (PR4) is expressed by $G_{(D)}=(1-D)(1+D)$, assuming now that symbol "D" is a delay operator. Furthermore, with respect to high density recording operations, it is known that the extended partial response class 4 (EPR4), the extended EPR4 of $G_{(D)}=(1-D)(1+D)^3$, and the MEEPR4 (Modified Extended EPR4) of $G_{(D)}=(1-D^2)(5+4D+2D^2)$ are suitably employed. The extended partial response class 4 is expressed by a higher-order of $G_{(D)}=(1-D)(1+D)^2$.

As the system capable of suppressing an occurrence of such an error, and the method for improving the decoding performance, the following idea is conceivable. In this decoding performance improving method, the errors which occur at the same time are locally corrected. That is, as described in the publication entitled "A New Target Response with Parity Coding for High Density Magnetic Recording Channels" written by Thomas Conway (IEEE Transactions on Magnetics, Vol. 34, No. 4, July 1998), the parity bit is added to the code word when the data is recorded, whereas the error detection/correction are carried out when the data is read. For example, the minimum distance decoding error in the extended EPR4ML is the 3-bit continuous error. Such an odd-numbered bit error can be detected during the reproducing operation by adding a 1-bit parity bit thereto.

SUMMARY OF THE INVENTION

In the above-described EEPR4ML made by combining the EEPR4 channel with the Viterbi decoding circuit, and MEEPR4ML made by combining the MEEPR4 with the Viterbi decoding circuit, both the Euclid distance between the correct information series and the erroneous information series, and also the error events at this time are express as follows:

EEPR4ML:
 (1) error event of distance 6
  ±(+−+)
 (2) error event of distance 8
  ±(+−+−. . . )(length is longer than, or equal to 4)
  ±(+−+00+−+)
 (3) error event of distance 10
  ±(+)
 (4) error event of distance 12
  ±(+−)

MEEPRML:
 (1) error event of distance 48
  ±(+−+)
 (2) error event of distance 68
  ±(+−+−. . . ) (length is longer than, or equal to 4)
 (3) error event of distance 70
  ±(+)
 (4) error event of distance 76
  ±(+−+000+−+)

In any case, the minimum distance decoding error is the 3-bit error, and this 3-bit error can be detected by employing such a parity code by which the odd-numbered bit error can be detected. However, as to the more than 4-bit continuous errors corresponding to the subsequent event errors having the short distances, the odd-numbered bit continuous bit errors contained therein cannot be detected. There is another problem that also as to the detectable odd-numbered bit error, the circuit required to specify this bit length during the error correction becomes complex.

As a consequence, an object of the present invention is to reduce an occurrence of such an error event which cannot be detected while an error is corrected.

To solve the above-described problems, a coding method according to the present invention is featured by that while a parity bit capable of detecting an error during reproducing operation is generated, a coding operation is carried out in such a manner that a specific pattern is not contained in a code word series to which this parity bit is added. At the same time, a coding apparatus of the present invention is arranged by that while a most likelihood path is searched based upon the Viterbi algorithm, such a transition path is not selected during the path searching stage. This transition path corresponds to a specific pattern which has been removed from the code word series by the coding operation. As a consequence, for example, if the specific pattern corresponds to "1111", then it is possible to avoid an occurrence of more than 4-bit continuous errors in the decoding errors. Since this coding arrangement is combined with the error detection/correction, the decoding characteristic can be improved.

BRIEF DESCRIPTION OF THE DRAWINGS

A more better understanding of the present invention is made by reading a detailed description in conjunction with the accompanying drawings, in which:

FIG. 6 is a table for indicating a conversion rule of a first bit converting circuit shown in FIG. 3;

FIG. 7 is a table for indicating a conversion rule of a first bit converting circuit shown in FIG. 3;

FIG. 15 is a table for indicating a conversion rule of a second bit converting circuit shown in FIG. 14;

FIG. 16 is a table for indicating a conversion rule of a second bit converting circuit shown in FIG. 13;

FIG. 17 is a table for indicating a conversion rule of a second bit converting circuit shown in FIG. 13;

DETAILED DESCRIPTION OF THE EMBODIMENTS

Referring now to drawings, various embodiments of the present invention will be described in detail.

Arrangement of Magnetic Disk Apparatus

Figure 1:
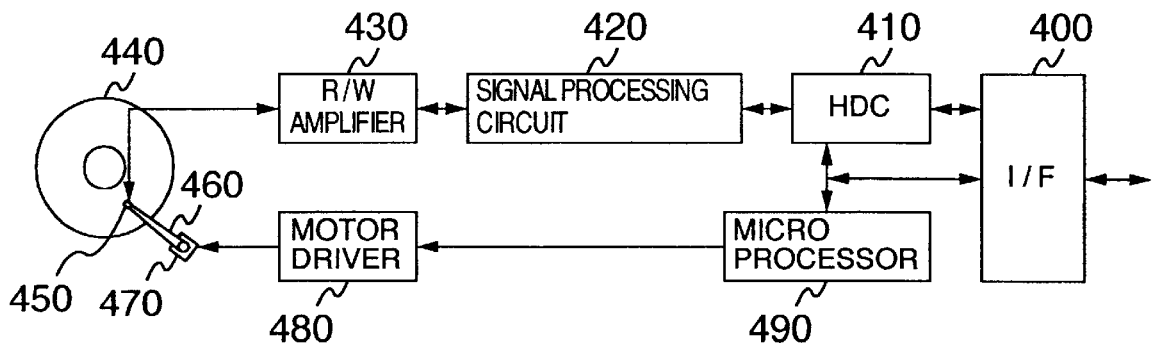
FIG. 1 is a schematic block diagram for showing an arrangement of a magnetic disk apparatus according to the present invention.

FIG. 1 shows a structural example of a magnetic disk apparatus.

The magnetic disk apparatus is arranged by an interface circuit 400 for interfacing with an external device, a hard disk controller (HDC) 410 for controlling data transmitting/receiving operation and a format, a signal processing circuit 420 for processing a record signal and a reproduction signal, a read/write amplifier 430 for amplifying a reproduction signal, and a magnetic disk 440 on which data is recorded. This magnetic disk apparatus is further arranged by a head 450 for recording and reproducing data with respect of the magnetic disk 440, an arm 460 for supporting the head 450, a voice coil motor 470 for transporting the head 450, a motor driver 480 for controlling the voice coil motor, and also a microprocessor 490 for controlling the hard disk controller 410 and the motor driver 480.

Internal Circuit Arrangement of Magnetic Recording/Reproducing Apparatus

Figure 2:
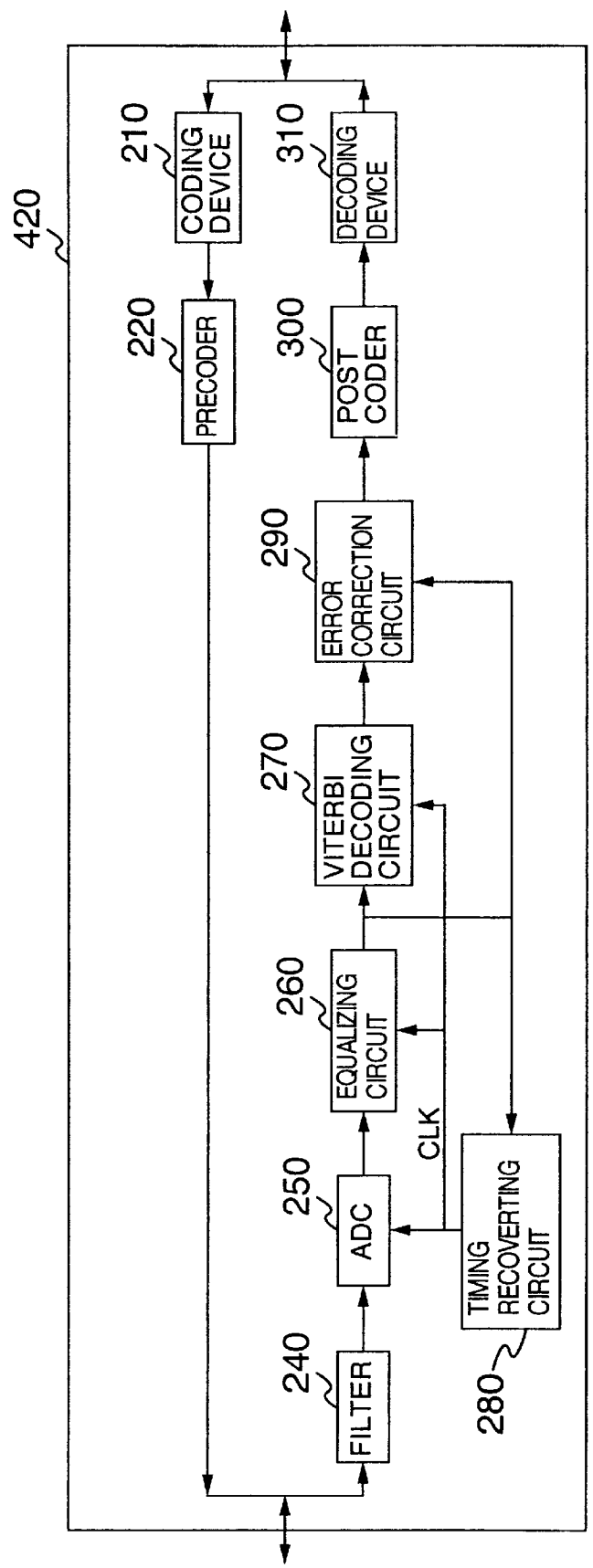
FIG. 2 is a block diagram for showing an internal circuit arrangement of a signal processing circuit according to the present invention.

FIG. 2 is an internal arrangement of a signal processing circuit employed in the magnetic recording/reproducing apparatus. This signal processing circuit 420 is operated in such a manner that when data is recorded, data outputted from the hard disk controller 410 is coded by a coding device 210, and thereafter, the coded data is supplied via a precoder 220 to the read/write amplifier 430 for writing data on a recording medium. Also, when data is reproduced, a high frequency (radio frequency) noise contained in a signal read from the recording medium by the read/write amplifier 430 is removed by a filter 240. The reproduced analog signal corresponding to the output from the filter 240 is converted into a digital signal by an ADC (analog-to-digital converter) 250, and thereafter, the waveform of this digital signal is equalized by an equalizing circuit 260. The equalized digital signal is discriminatively reproduced by a Viterbi decoding circuit 270. After a specific error of this reproduction signal is corrected by an error correcting circuit 290, this error-corrected reproduction signal is converted via a post coder 300 by a decoding device 310 into the original data. Then, this original data is outputted to the hard disk controller 410. The operation timing of the ADC 250, the equalizing circuit 260, and a most likelihood decoder is determined based upon a clock signal CLK extracted by a timing recovery circuit 280.

Figure 3:
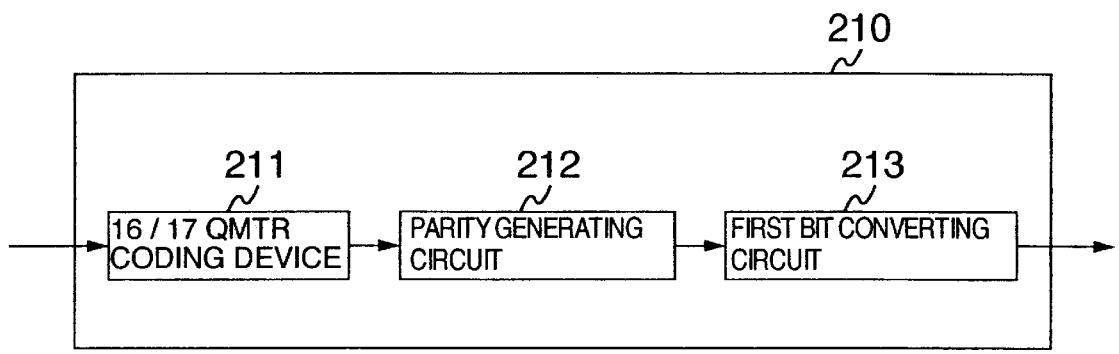
FIG. 3 is a block diagram for showing an internal arrangement of a coding device according to the present invention.

As indicated in FIG. 3, the coding device 210 is constituted by a 16/17 QMTR (Quasi-Maximum Transition Run) coding device 211, a parity generating circuit 212, and a first bit converting circuit 213. As to the 16/17 QMTR coding device 211, an arranging method of the 16/17 QMTR coding device 211 assuming that L=11 and M=32 is described in, for example, JP-A-11-243345. While 16-bit input data is handled as 1 block, this 16/17 QMTR coding device 211 converts this 16-bit data into a 17-bit code word.

This conversion is featured with respect to the converted code word series by giving the below-mentioned restrictions:

a) The continuous number of "1" in the bit stream of the coded code word is smaller than, or equal to 3;

b) the continuous numbers of "1" in MSB and LSB of the coded code word is smaller than, or equal to 2;

c) the continuous number of "0" in the bit stream if the coded code word is smaller than, or equal to "L" bit; and d) the continuous number of the catastrophe series "- - - 11001100- - - " in the bit stream of the coded code word is smaller than, or equal to "M" bits.

Figures 4, 5:
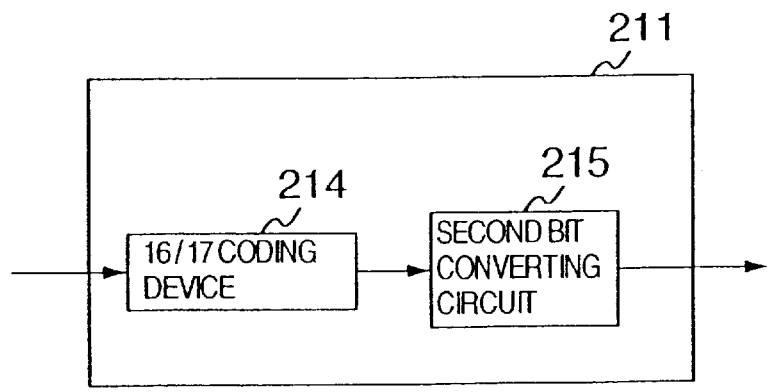
FIG. 4 is a block diagram for indicating an internal arrangement of a 16/17 QMTR coding device shown in FIG. 3.
FIG. 5 is a table for indicating a conversion rule of a first bit converting circuit shown in FIG. 3.

As indicated in FIG. 4, this 16/17 QMTR coding device 211 is arranged by a 16/17 decoding device 214 and a second bit converting circuit 215. Then, the above-explained feature may be realized by both the coding restriction with respect to the 17-bit code word coded by the 16/17 coding device 214, and also the coding restriction with respective the connection portion among the 17-bit continuous code words by the second bit converting device 215.

The parity generating circuit 212 generates a parity bit and adds this parity code to data. This parity code is used to detect a specific error which should be corrected by an error correcting circuit 290. This specific error occurs data outputted from a Viterbi decoding circuit 270 having a certain finite length. For instance, in such an arrangement for adding a 1-bit parity code to L-bit data, the parity generating circuit 212 generates a parity bit in such a manner that a summation of (L+1)-bit recorded data via the precoder 220 must become an even number. Since a summation of outputs of the Viterbi decoding circuit similarly becomes an even number in the case that this recorded data is reproduced in a system where no error occurs, if an odd-bit error happens to occur, then the error correcting circuit 290 can detect this bit error.

Assuming now that while the precoder 220 performs the preceding operation in accordance with 1/(1+D), an output series of the coding device 210 is equal to $\{X_n\}$ and an output series of the precoder 220 is equal to $\{y_n\}$, the output series $\{y_n\}$ of the precoder and the summation thereof during a finite time period (L+1) bit are given as follows:

$$y_o = y_{-1} + x_0 \quad (1)$$
$$y_1 = y_0 + x_1 = y_{-1} + x_0 + x_1$$
$$\vdots$$
$$+) \; y_L = y_{-1} + x_0 + x_1 + \ldots + x_L$$
$$y_0 + y_1 + \ldots + y_L = (L+1)(y_{-1} + x_0) + Lx_1 +$$
$$(L-1)x_2 + \ldots + 2x_{L-1} + x_L$$

As a result, as explained above, if the summation is made as the even parity, then such a parity bit "$X_L$" may be calculated by the following formula in order that this parity bit "$X_L$" is added so as to set the modulo 2 given in the left hand of the formula (1) to 0:

$$X_L = (y_{-1} + x_0) + x_2 + x_4 + \ldots + x_{L-2} \quad (L: \text{even}) \quad (2)$$
$$= x_1 + x_3 + x_5 + \ldots + x_{L-2} \quad (L: \text{odd})$$

As previously explained, as to the output from the 16/17 QMTR coding device 211, the continuous length of 1 is restricted to be smaller than, or equal 3. However, there is such a case that since the parity bit generated in the parity generating circuit 212 is added to the code word, the continuous length of 1 is increased. This condition may be similarly applied to another continuous length of 0 and a continuous length of a catastrophe series.

The first bit converting circuit 213 performs a process operation capable of avoiding a breach of a coding restriction, which is caused by adding such a parity bit. This first bit converting circuit 213 judges as to whether or not the breach of the coding restriction occurs by checking the parity bit and several bits located before/after this parity bit. If the breach of this coding restriction occurs, then the first bit converting circuit 213 converts the bit stream in order to follow the code restriction. Also, this bit stream to be converted must be detectable during the reproducing operation as to whether or not the bit conversion is carried out.

Operation Sequence of Decoding Device

A description will now be made of an operation sequence of the decoding device 210 in the case that the 16/17 QMTR coding device 214 shown in FIG. 4 is employed.

One case will now be considered that a 1-bit parity bit is added every a 17-bit code word. In this case, the process operation executed in the second bit converting circuit 215 is no longer required, but the 17-bit code word coded by the 16/17 coding device 214 is directly inputted to the parity generating circuit 212. In this parity generating circuit 212, the parity bit is generated, and then is added to the code word. The first bit converting circuit 213 judges as to whether or not the bit conversion is carried out by checking this generated parity bit and the code words located before/after this parity bit. FIG. 5, FIG. 6, and FIG. 7 show a conversion rule of this first bit converting circuit 213. In this conversion rule, symbol "prev–LSB" indicates a lower bit of a code word located just before a parity bit, and symbol "curr–MSB" shows an upper bit of a code word located just after the parity bit. In this case of FIG. 5 where a continuous length of 1 becomes larger than, or equal to 4 because the parity bit is added, when 9-bit values (containing parity bit) located before/after the parity bit are made coincident with any one of these 20 pieces, these bit values are converted into a bit stream shown in the right side of the conversion table. Similarly, since the bit conversions shown in FIG. 6 and FIG. 7 are carried out, the continuous lengths of 0 and the continuous lengths of catastrophe series can be restricted.

The conversion rule employed in this converting process operation is required to be capable of judging as to whether or not the bit conversion is performed in order that the bit stream after being converted can be reverse-converted while this bit stream is decoded. To this end, 4 bits of "prev–LSB" and "curr–MSB" after being converted in FIG. 5, FIG. 6 and FIG. 7 are set to prev–LBS+0111, or curr–MSB=1110, namely 3 sets of "1" are continued at the code end, which is discriminated from the above-case (b) that the bit conversion influenced by the code restriction does not occur. Also, it is prohibited that the continuous length of "1" by the bit conversion is increased. Also, increasing of the continuous length of "0" and also increasing of the continuous length of the catastrophe series are suppressed to minimum values. If these conditions can be satisfied, then the above-explained conversion rules are not limited to those of FIG. 5, FIG. 6 and FIG. 7.

In the case that a 1-bit parity bit is added to a plurality of 17-bit code words, control operations differ from each other, depending upon such a fact as to whether or not the insertion timing is equal to such a timing when a parity bit is inserted between two sets of 17-bit continuous code words coded by the 16/17 coding device 214. If this insertion timing is equal to such a timing that the 1-bit parity bit is inserted between the code words, then a similar process operation to the above-described process operation that the 1-bit parity bit is added to the 17-bit code word is carried out. In other words, the output of the 16/17 coding device 214 is not processed in the second bit converting circuit 215, but is entered into the parity generating circuit 212. Also, as to the data stream to which the generated parity bit has been added, the code restriction is applied in the first converting circuit 213. On the other hand, in such a case that the parity bit is not inserted between the code words, the code word coded by the 16/17 QMTR coding device 211 is directly used as the output of the coding device 210, while the data are not treated in the parity generating circuit 212 and the first bit converting circuit 213. These process operations are controlled in response to a control signal (not shown).

While the above-explained process operation is carried out, the coding device 210 can restrict that the continuous length of "1" in the coded output of this coding device 210 is made smaller than, or equal to 3, and furthermore, both the continuous length of "0" and the continuous length of the catastrophe series are made smaller than, or equal to a constant number. Also, since the parity code is used, when the odd-numbered bit errors happen to occur in these blocks, this fact can be detected.

Operation of Viterbi Decoding Device

Figure 8:
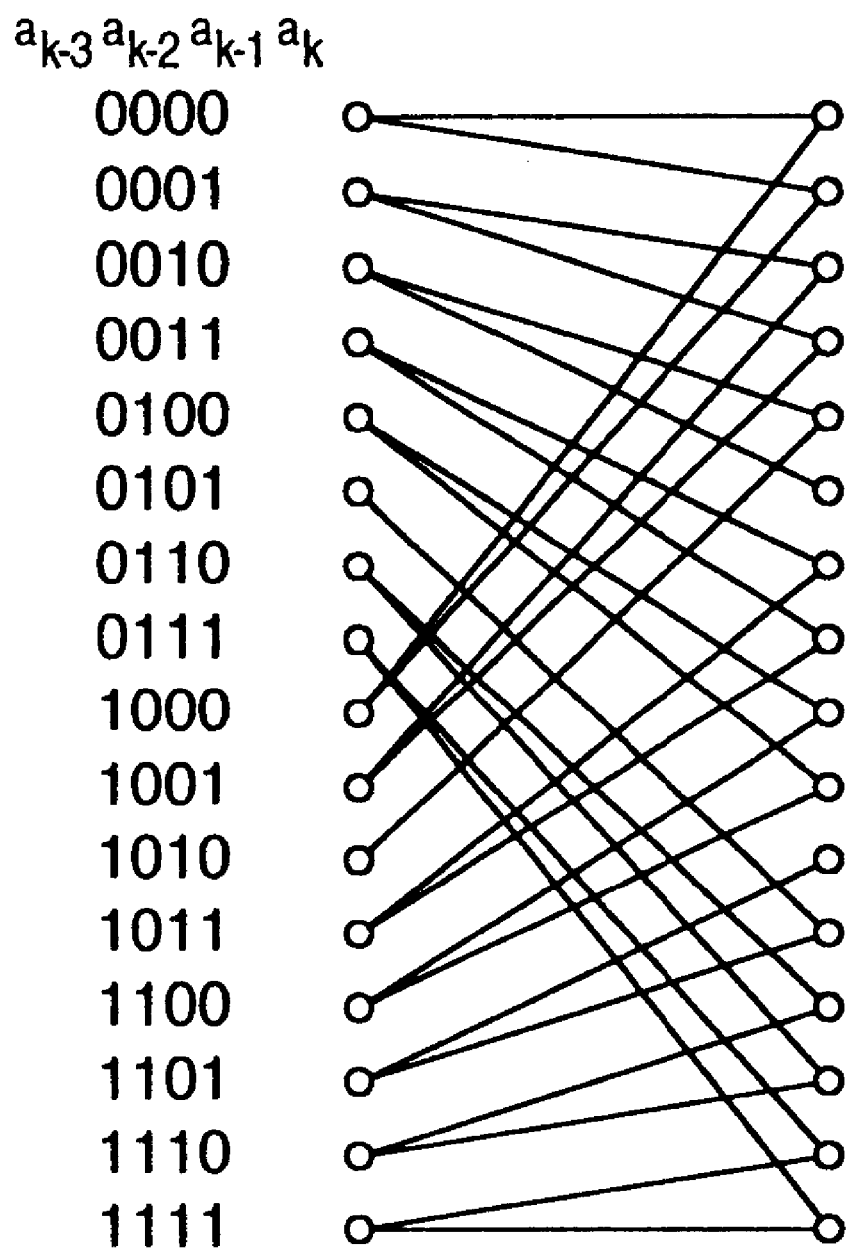
FIG. 8 is a trellis diagram of an extended EPR4 according to the present invention.

Next, the operation of the Viterbi decoding device 270 will now be explained. In order that the restriction under which the continuous length of "1" of the code word is made smaller than, or equal to "3" by the decoding device may be reflected on the decoding performance, the Viterbi decoding circuit 270 is arranged by such that this Viterbi decoding circuit 270 cannot take a transition path corresponding to a code word "1111" in a stage for searching a most likelihood path. For instance, in an extended EPR4 channel, as shown in FIG. 8, a branch corresponding to a state transition 0101->1010, and another branch corresponding to a state transition 1010->0101 are deleted in a trellis diagram. A minimum distance decoding error in the 16/17 GCR code will occur such as (0111<->1110) and (1111<->0110) on the code. Namely, bit errors happen to occur. The latter error case may be avoided by restricting the above-explained code and transition path.

Also, in the former bit error case, considering that the code is extended up to 6 bits, error patterns thereof are given as four error patterns: (001110<->011100), (001111<->011101), (101110<->111100), (101111<->111101). These error patterns other than the first-listed error pattern does not occur by restricting the codes and the transition paths. As a consequence, the occurrence probability as to the minimum distance decoding error becomes ⅛, and furthermore, all of the continuous errors larger than, or equal to 4 bits can be deleted by restricting that the continuous length of "1" becomes smaller than, or equal to 3 on the code and the transition path is limited.

Figure 9:
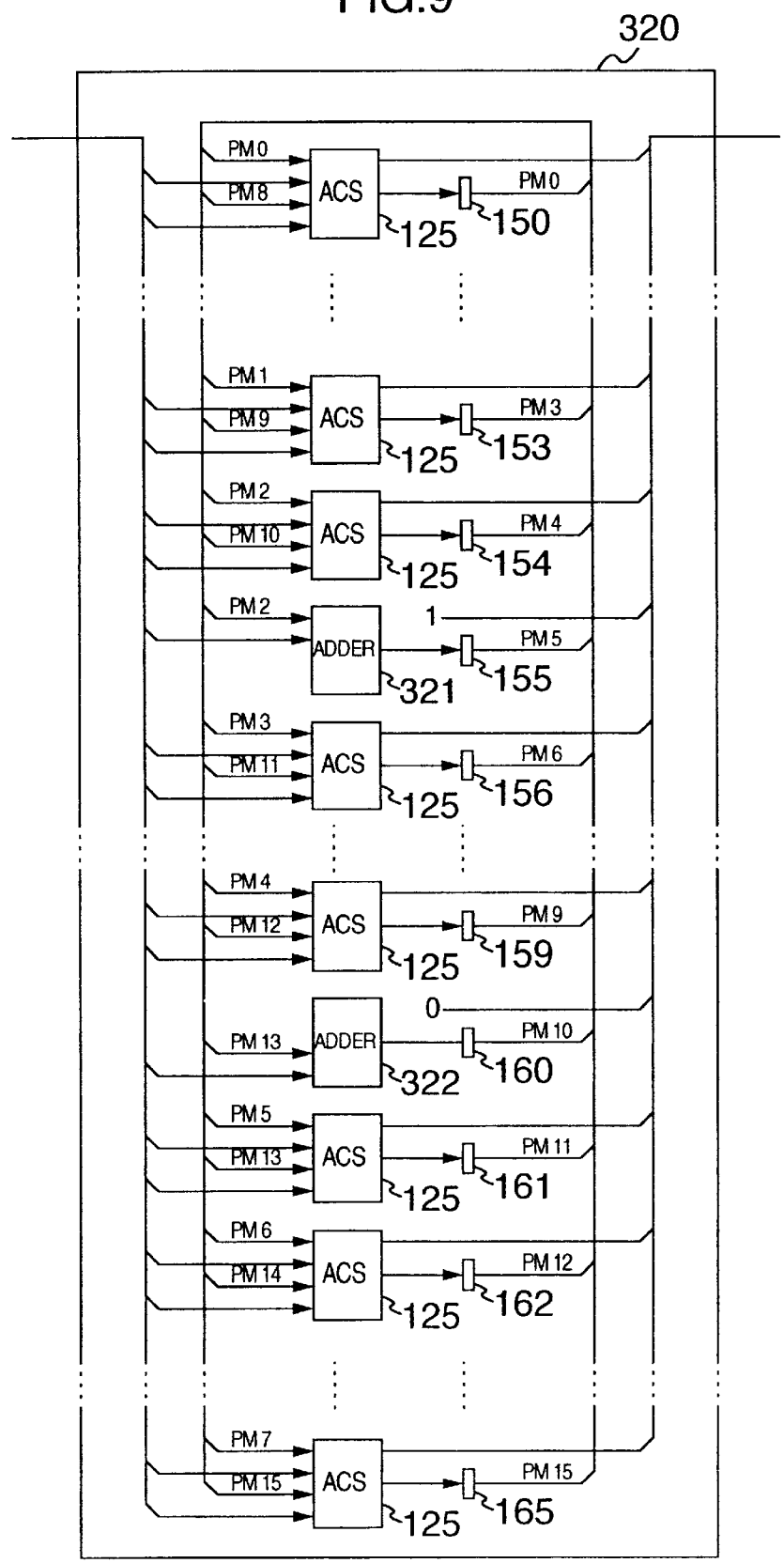
FIG. 9 schematically shows an arrangement of an ACS circuit according to the present invention.

FIG. 9 schematically shows an internal arrangement of an ACS circuit 320 employed in the Viterbi decoding circuit. Different from the internal arrangement of the ACS circuit provided in the conventional Viterbi decoding circuit, the calculation executed in the ACS unit 125 of the conventional arrangement are substituted by an adder 321 and another adder 322, which own only such a function capable of adding a branch metric value to a path metric value by receiving such a fact that the branch corresponding to the state transition 1010->0101 and the branch corresponding to the state transition 1010->1010 in the trellis diagram of FIG. 8 are deleted. At this time, selection signals outputted to a path memory circuit are set to fixed values of "1" and "0" in order to keep such a condition that a single branch is selected.

Arrangement of Error Correcting Circuit

Figure 10:
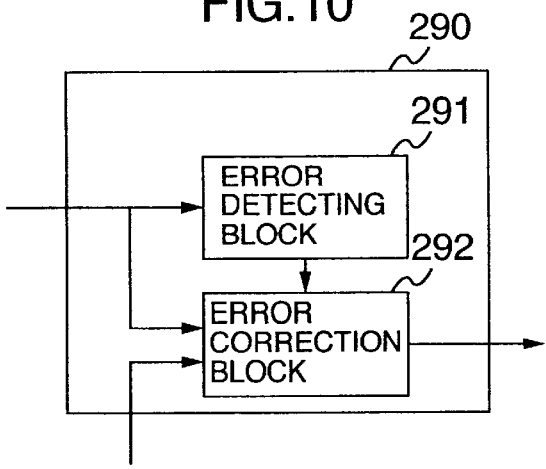
FIG. 10 is a schematic block diagram for indicating an arrangement of an error correcting circuit shown in FIG. 2.
Figure 11:
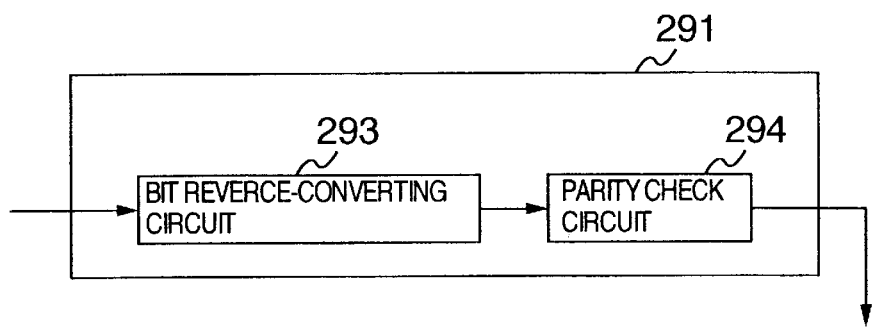
FIG. 11 is a schematic block diagram for indicating an internal arrangement of an error detecting block shown in FIG. 10.

Next, an internal arrangement of the error correcting circuit 290 will be explained with reference to FIG. 10, FIG. 11, and FIG. 12. The error correcting circuit 290 shown in FIG. 10 is constituted by two blocks, namely an error detection block 291 and an error correction block 292. In the case that the error is detected by the error detecting block 291, an error correction is carried out with respect to a specific position in the error correcting block 292. The error detecting circuit 290 can perform the error detecting operation in a manner opposite to the parity bit generating/adding operation by the coding device. First, a bit reverse-converting circuit 293 indicated in FIG. 11 detects as to whether or not the bit conversion is carried out between the 17-bit coded codes when the codes are produced. This bit-conversion detecting operation may be achieved by checking as to whether or not the coupling portion between the bit-converted code words is equal to either a bit value of (0111,0*) or another bit value of (*0, 1110). These values are not produced when the bit conversion is not carried out, and symbol "*", implies "don't care." In such a case that the bit of the coupling portion is not made coincident with this bit stream, the bit reverse-converting circuit 293 judges that no bit conversion is performed during the recording operation, and therefore does not perform the reverse conversion. To the contrary, when the bit of the coupling portion is made coincident with this bit stream, the bit reverse-converting circuit 293 executes an operation opposite to the bit conversions which have been originally carried out in FIG. 5, FIG. 6, and FIG. 7, so that the reverse-conversion may be realized.

The output of the bit reverse-converting circuit 293 is inputted into a parity check circuit 294 so as to check a parity bit. Sine the modulo 2 of the summation of a specific (L+1) bit of data blocks is set to 0 by the above-explained formula (2) when the parity bit is added, the parity check is carried ut by calculate a summation of the (L+1)-bit data blocks corresponding thereto and also by check as to whether or not a modulo 2 thereof becomes 1. When this modulo 2 becomes 1, the error detecting block judges that the odd-numbered bit errors are present in the data block, and then the error correcting bock 292 searches the position of the error present in the data block to correct the error.

Figure 12:
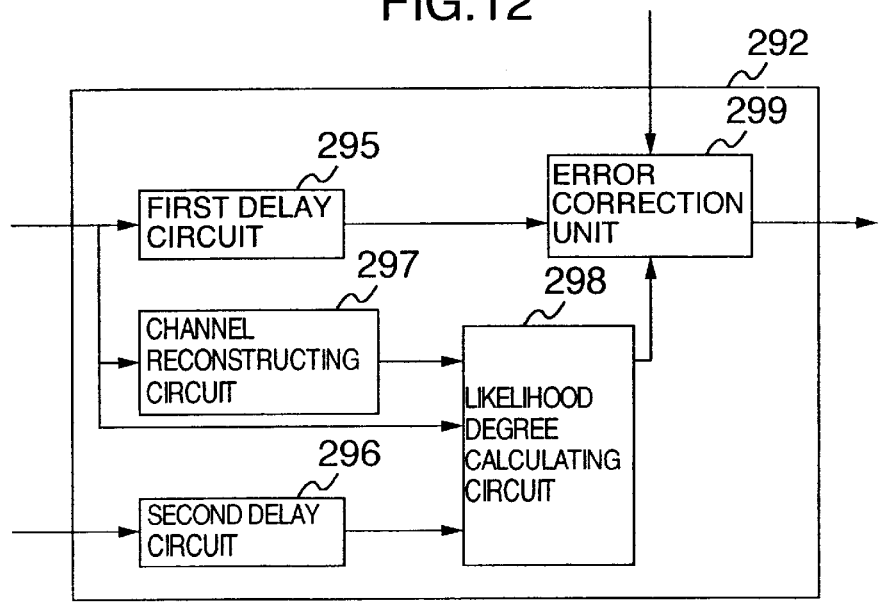
FIG. 12 is a schematic block diagram for showing an internal arrangement of an error correcting block indicated in FIG. 10.

In the error correcting block 292 indicated in FIG. 12, a reproduction signal to a first delay circuit 295 is entered into this first delay circuit 295, a channel reconstructing circuit 297, and a likelihood degree calculating circuit 298. The first delay circuit 295 delays the position of the error when the error correction is performed, the time required to calculate the error pattern, and the output from the Viterbi decoding circuit 270. On the other hand, the channel reconstructing circuit 297 convolutes the output of the Viterbi decoding circuit 270 by a channel response so as to produce a channel reconstruction signal "$a_k$". The output of the equalizing circuit 260 shown in FIG. 2 is entered into the second delay circuit 296 so as to produce such a delay signal "$y_k$" which is delayed by the calculation time required in the Viterbi decoding circuit 270. In this case, when there is completely no loss caused by the noise and the like, the delay signal "$y_k$" is equal to the channel reconstruction signal "$a_k$." In the likelihood degree calculating circuit 298, the below-mentioned calculation (3) is firstly carried out:

$$R_k = [\{y_k-(a_k+\Delta a_k)\}^2 - (y_k a_k)^2] \quad (3)$$

It is assumed that an error pattern to be corrected is, for example, a 1-bit {±(+)} error and a 3-bit {±(+−+)}, and symbol "$\Delta a_k$" contained in the formula (3) is equal to such a value produced by convoluting these errors by the channel response. At this time, symbol $(y_k-a_k)^2$ of the right hand in the formula (3) represents a likelihood degree with respect to the most likelihood decoding series selected by the Viterbi decoding circuit, and symbol $\{y_{k-(ak)}+\Delta a_k\}^2$ represents a likelihood degree of a series obtained by adding the above-explained error to the most likelihood decoding series. When the most likelihood decoding series becomes more certain, a value of likelihood degree differences expressed by this $R_k$ is increased. When the error happens to occur, the probability that the likelihood difference is decrease is conversely increased. As a consequence, both the likelihood difference "$R_k$" calculated by employing "$\Delta a_k$" corresponding to the above-explained 1-bit error, and also the likelihood difference $R_k$ corresponding to the 3-bit error are calculated with respect to all of such positions where the respective errors happen to occur. Among these values, an error pattern having a minimum value and a position thereof are acquired, so that a correction subject can be predicted.

Both the correction pattern and the correction position, which are calculated by the likelihood calculating circuit 298 in this manner, are entered into an error correction unit 299, and when the error is detected by the error detecting block 291, the error correction is carried out with respect to the output of the Viterbi decoding circuit by the error correcting circuit 290, which is delayed by the first delay circuit 295. The reproduction signal which has been error-corrected is detected via the post coder 300 shown in FIG. 2 by the decoding device 310. Thereafter, the decoded reproduction signal is outputted to the controller 200. Alternatively, this error correcting circuit 290 may be provided at a post stage of this post coder 300. The decoding device 310 decodes the reproduction signal which has been error-corrected after being processed by the post coder 300. This decoding operation is completely reversed from the process operation executed in the coding device 210. That is, this process operation may be realized by the bit reverse-conversion in the connection portion between the codes, the deletion of the parity bit, and the 16/17 decoding operation.

Arrangement/Operation of Second Signal Processing Apparatus

Figure 13:
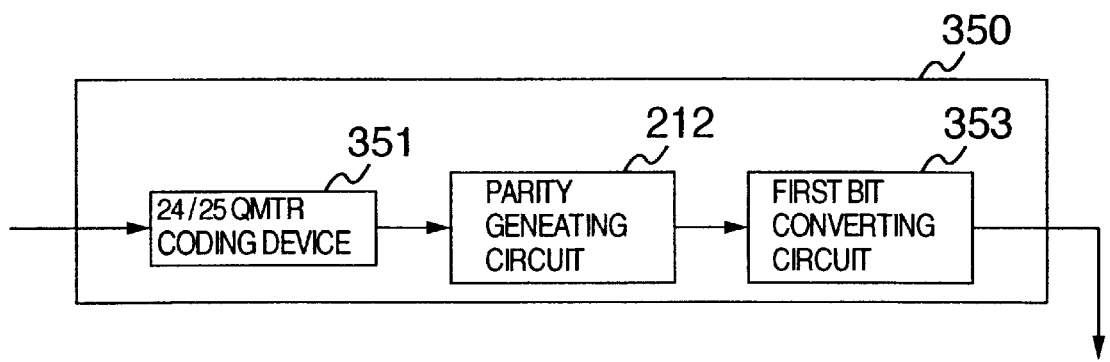
FIG. 13 is a block diagram for showing an internal arrangement of a coding device according to the present invention.
Figure 14:
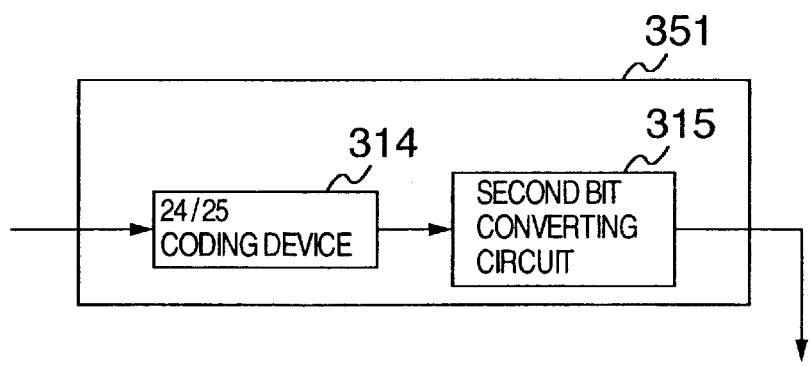
FIG. 14 is a block diagram for indicating an internal arrangement of a 24/25 QMTR coding device shown in FIG. 13.

Referring now to FIG. 13 and FIG. 14, a second embodiment mode of the present invention will now be described.

A basic arrangement of the second embodiment mode is similar to that of the first embodiment mode. However, this second embodiment mode owns a different technical aspect as to a coding method of recorded data, a most likelihood decoding method of reproduced data, and a decoding method. As a consequence, the coding device 210, the decoding device 310, and the Viterbi decoding circuit 270 indicated in FIG. 2 are replaced by a coding device 350, a decoding device 370 (not shown), and a Viterbi decoding circuit 360 (not shown). Now, this different technical aspect of the second embodiment mode will be mainly explained.

FIG. 13 represents an internal arrangement of the coding device 350 employed in a signal processing circuit according to this embodiment mode. The coding device 350 is arranged by a 24/25 QMTR coding device 351, a parity generating circuit 212, and a first bit converting circuit 353. Also, as indicated in FIG. 14, the 24/25 QMTR coding device 351 is arranged by a 24/25 coding device 314 and a second bit converting circuit 315. Then, the above-explained 24/25 QMTR coding device 351 may realize both the coding restriction with respect to the 25-bit code word coded by the 24/25 coding device 314, and also the coding restriction with respect to the connection portion among the 25-bit continuous code words by the second bit converting device 315.

The coding operation by this 24/25 coding device 314 is featured by providing the following 4 restrictions. That is, with respect to the converted code word, the below-mentioned restrictions a) to d) are provided:

a). The continuous number of "1" in the bit stream of the 25-bit coded code word is smaller than, or equal to 4;

b). the continuous numbers of "1" in MSB and LSB of the 25-bit coded code word is smaller than, or equal to 2;

c). the continuous number of "0" in the bit stream of the 25-bit coded code word is smaller than, or equal to several "L"; and d). the 25-bit coded code word does not contain the catastrophe series " - - - 11001100 - - - " having a length of "M".

The code restrictions a) and b) are directed to such a condition that the continuous number of "1" in the coded code word is kept smaller than, or equal to 4. The code restriction (c) is directed to limit the length "0" in order to guarantee the operation of a timing recovery circuit 180. The code restriction d) is required to save merge of a path within a constant time period in the Viterbi decoding circuit.

For example, assuming now that the above-described continuous length "L" of "0" is equal to 10, a continuous length of "0" at an end of a code word is smaller than, or equal to 5 bits, or a continuous length "M" of a catastrophe series " - - - 11001100 - - - " is equal to 25. In this case, the code restriction of the latter case is equivalent to such a condition that the below-mentioned 4 code words are removed from the code word: That is, "00110011 - - - 0110", "01100110 - - - 1100", "11001100 - - - 1001 ", "10011001 - - - 0011".

It should be noted that a total number of code words which is not deviated from these code restrictions is equal to 17,888,646, and this total number becomes larger than a total number (1,677,216) of code words required in 24-bit coding operation. Therefore, this can be realized.

The second bit converting device 315 executes such a process operation that if the catastrophe series is continued to bridge the code words under the above-explained code restriction, then this continuous bridge is cut off. In other words, the second bit converting device 315 judges as to whether or not the catastrophe series is bridged over the code words by checking the several bits located before/after the connection portion of the continued code words. In such a bridge case, for instance, the second bit converting device 315 converts the bit stream in accordance with a conversion rule shown in FIG. 15. The conversion rule employed in this converting process operation is required to be capable of judging as to whether or not the bit conversion is performed in order that the bit stream after being converted can be reverse-converted while this bit stream is decoded. To this end, in the bit convention executed based upon the conversion rule of FIG. 15, 3 sets of "1" are continued at any one of the converted code word ends, which is discriminated from the above-case (b) that the bit conversion influenced by the code restriction does not occur. Also, it is prohibited that the continuous length of "1" by the bit conversion is increased. Also, increasing of the continuous length of "0" is suppressed to a minimum value. If these conditions can be satisfied, then the above-explained conversion rule is not limited to that of FIG. 15.

Also, the second bit converting device 315 is no longer required if such a case may occur. That is, a path memory length by which the path can be merged can be prepared in the Viterbi decoding device 360 with respect to the longest catastrophe series which is produced in the output of the 24/25 coding device 314.

A parity generating circuit 212 shown in FIG. 13 may use such a parity generating circuit employed in the above-explained coding device 210 shown in FIG. 3. As previously described in the first embodiment, there is such a case that since the parity bit generated in the parity generating circuit 212 is added to the code word, the continuous length of 1 is increased. This condition may be similarly applied to another continuous length of 0 and a continuous length of a catastrophe series.

The first bit converting circuit 353 performs a process operation capable of avoiding a breach of a coding restriction, which is caused by adding such a parity bit. This first bit converting circuit 353 judges as to whether or not the breach of the coding restriction occurs by checking the parity bit and several bits located before/after this parity bit. If the breach of this coding restriction occurs, then the first bit converting circuit 353 converts the bit stream in order to follow the code restriction. Also, this bit stream to be converted must be detectable during the reproducing operation as to whether or not the bit conversion is carried out.

Operation Sequence of Decoding Device

A description will now be made of an operation sequence of the decoding device 350 in the case that the 24/25 QMTR coding device 314 shown in FIG. 14 is employed.

One case will now be considered that a 1-bit parity bit is added every a 25-bit code word. In this case, the process operation executed in the second bit converting circuit 315 is no longer required, but the 25-bit code word coded by the 24/25 coding device 314 is directly inputted to the parity generating circuit 212. In this parity generating circuit 212, the parity bit is generated, and then is added to the code word. The first bit converting circuit 353 judges as to whether or not the bit conversion is carried out by checking this generated parity bit and the code words located before/after this parity bit. FIG. 16, and FIG. 17 show a conversion rule of this first bit converting circuit 353. In this case of FIG. 16 where a continuous length of 1 becomes larger than, or equal to 5 because the parity bit is added, when 9-bit values (containing parity bit) located before/after the parity bit are made coincident with any one of these 4 cases, these bit values are converted into a bit stream shown in the right side of the conversion table. Similarly, since the bit conversions shown in FIG. 17 is carried out, the continuous lengths of catastrophe series can be restricted.

As previously described, the conversion rule employed in this bit converting process operation is required to be capable of judging as to whether or not the bit conversion is performed in order that the bit stream after being converted can be reverse-converted while this bit stream is reproduced sets of "1" are continued at the code end, which is discriminated from the above-case (b) that the bit conversion influenced by the code restriction does not occur. Also, it is prohibited that the continuous length of "1" by the bit conversion is increased. Also, increasing of the continuous length of "0" and also increasing of the continuous length of the catastrophe series are suppressed to minimum values. If these conditions can be satisfied, then the above-explained conversion rules are not limited to those of FIG. 16 and FIG. 17.

In the case that a 1-bit parity bit is added to a plurality of 25-bit code words, control operations differ from each other, depending upon such a fact as to whether or not the insertion timing is equal to such a timing when a parity bit is inserted between two sets of 25-bit continuous code words coded by the 24/25 coding device 314. If this insertion timing is equal to such a timing that the 1-bit parity bit is inserted between the code words, then a similar process operation to the above-described process operation that the 1-bit parity bit is added to the 25-bit code word is carried out. In other words, the output of the 24/25 coding device 314 is not processed in the second bit converting circuit 215, but is entered into the parity generating circuit 212. Also, as to the data stream to which the generated parity bit has been added, the code restriction is applied in the first converting circuit 353. On the other hand, in such a case that the parity bit is not inserted between the code words, the code word coded by the 24/25 QMTR coding device 311 is directly used as the output of the coding device 350, while the data are not treated in the parity generating circuit 212 and the first bit converting circuit 353. These process operations are controlled in response to a control signal (not shown).

While the above-explained process operation is carried out, the coding device 350 can restrict that the continuous length of "1" in the coded output of this coding device 350 is made smaller than, or equal to 4, and furthermore, both the continuous length of "0" and the continuous length of the catastrophe series are made smaller than, or equal to a constant number. Also, since the parity is used, when the odd-numbered bit errors happen to occur in these blocks, this fact can be detected.

Operation of Viterbi Decoding Device

Figure 18:
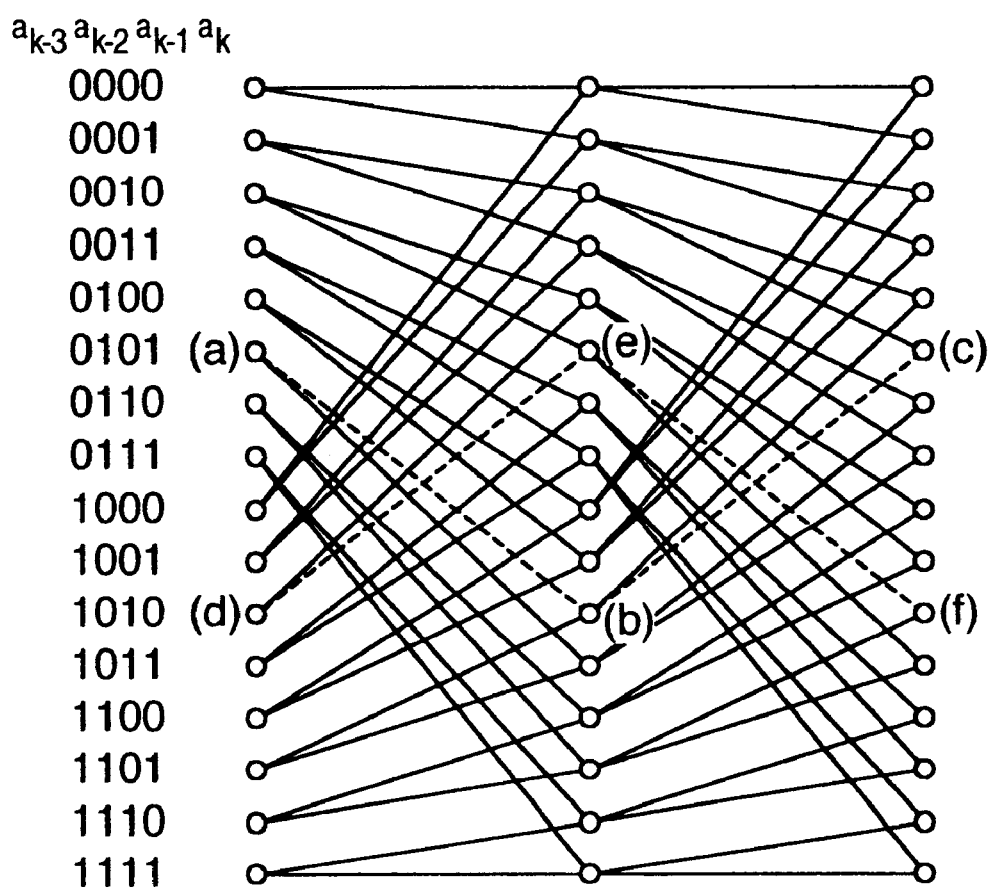
FIG. 18 is a trellis diagram of an extended EPR4 according to the present invention.

Next, the operation of the Viterbi decoding device 360 will now be explained. In order that the restriction under which the continuous length of "1" of the code word is made smaller than, or equal to "4" by the coding device may be reflected on the decoding performance, the Viterbi decoding circuit 360 is arranged by such that this Viterbi decoding circuit 360 cannot take a transition path corresponding to a code word "11111" in a stage for searching a most likelihood path. For instance, in an extended EPR4 channel, a branch corresponding to a state transition 01010->10101, and another branch corresponding to a state transition 10101->01010 are deleted in a trellis diagram. FIG. 18 indicates a trellis diagram of an extended EPR4, which is extended along a temporal direction. The state transitions of (a)→(c) and (d)→(f) indicated by a broken line shown in FIG. 18 indicate the above-described two state transitions. As shown in this drawing, since the state transitions bridge a plurality of time steps, the transition paths in the nodes (c) and (f) are selected by referring to the transition states occurred at the nodes (b) and (e) which are located before these nodes (c) and (f). In other words, when the transition from the node (a) is selected at the node (b), no transition from the node (b) is performed at the node (c). This may be similarly applied to the node (f).

Figure 19:
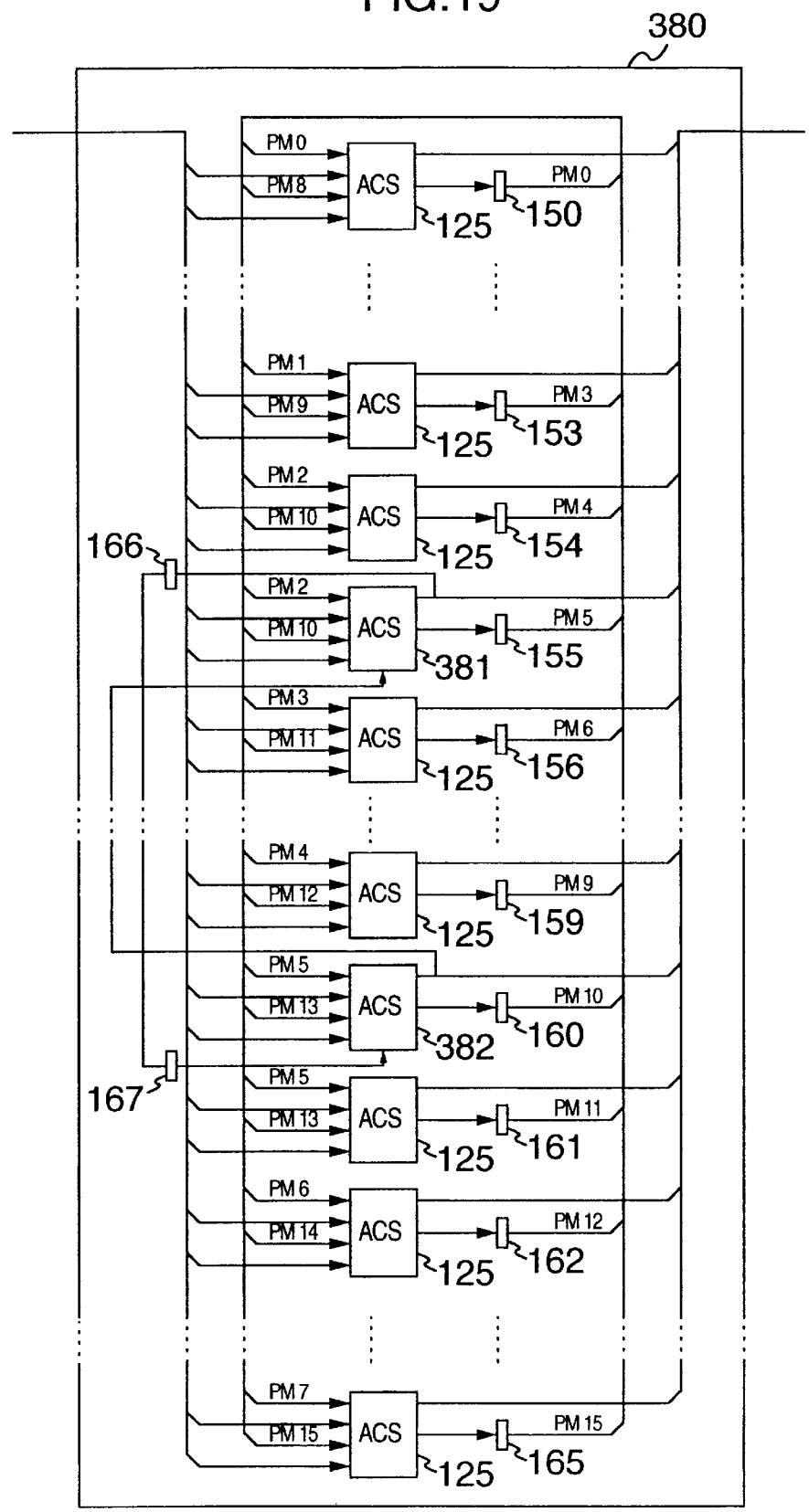
FIG. 19 schematically shows an arrangement of an ACS circuit according to the present invention.

As to the Viterbi decoding circuit 360 of this embodiment, an internal arrangement of an ACS circuit thereof is made different, as compared with the conventional Viterbi decoding circuit. FIG. 19 indicates an internal arrangement of the ACS circuit 380 applied to the Viterbi decoding circuit 360. An ACS unit 381 and an ACS unit 382 (both are not shown), which select a path under such states corresponding to the above-explained nodes (c) and (f), input selected results obtained before one time instant via the respective latches 167 and 166. Then, the ACS units 381 and 382 reflect these inputted selection results on the selection of the path. In a 24/25 GCR code, a minimum distance decoding error is equal to a 3-bit decoding error. This 3-bit decoding error can be detected/corrected by an error correcting circuit 290. Also, as to a 4-bit decoding error, such a bit error as (01111←—→11110) and (11111←—→01110) happens to occur. The latter error case may be avoided by restricting the above-explained code and transition path.

Also, in the former bit error case, considering that the code is extended up to 7 bits, error patterns thereof are given as four error patterns: (0011110<->0111100), (0011111<->0111101), (1011110<->1111100), (1011111<->1111101). These error patterns other than the first-listed error pattern does not occur by restricting the codes and the transition paths. As a consequence, the occurrence probability as to the 4-bit decoding error becomes ⅛, and furthermore, all of the continuous errors larger than, or equal to 5 bits can be deleted by restricting that the continuous length of "1" becomes smaller than, or equal to 4 on the code and the transition path is limited.

In accordance with the circuit arrangements described in this second embodiment mode, all of the 4-bit decoding errors cannot be avoided, which could not be corrected by the error correcting circuit 290. However, the coding rate can be increased, as compared with that of the first embodiment. In particular, when a 1-bit parity bit is added to two code words, this coding rate becomes (24×2)/(25×2+1)=16/17, by which the rate loss produced by adding the parity bit in the first embodiment can be suppressed.

A decoding device 370 decodes the reproduction signal which has been error-corrected after being processed by the post coder 300. This decoding operation is completely reversed from the process operation executed in the coding device 350. That is, this process operation may be realized by the bit reverse-conversion in the connection portion between the codes, the deletion of the parity bit, and the 24/25 decoding operation.

As apparent from the foregoing descriptions, in order that all of the 4-bit decoding errors are deleted, such an error pattern (0011110←—→0111100) is never produced. To this end, a coding device capable of coding the code word which does not contain either a bit stream "001111" or another bit stream "111100"; a decoding device capable of decoding this bit stream; and also a Viterbi decoding device capable of removing the state transition corresponding to the above-explained bit stream may be employed. These circuit arrangements may be readily conceived based upon the circuit arrangements according to the first embodiment and the second embodiment.

As previously described in detail, in accordance with the present invention, it is possible to provide such a coding method capable of effectively performing the error correction, and further to improve the decoding performance of the recording/reproducing apparatus.

What is claimed is:

1. A coding apparatus comprising:

a QMTR (Quasi-Maximum Transition Run) coding device for inputting a data stream, and translating said data stream into a coded bit stream in which a number of continuous "1"s in a bit stream of a coded word is limited smaller than or equal to r bits;

a parity generating circuit for inputting said coded bit stream outputted from said QMTR coding device, generating a parity bit with respect to a fixed length block of said coded bit stream, and adding said parity bit to said fixed length block of said coded bit stream; and a bit converting circuit for inputting the bit stream with parity outputted from said parity generating circuit, and converting said parity bit, a bit stream of a predetermined number of bits in said bit stream immediately before said parity bit and a bit stream of a predetermined number of bits in said bit stream immediately after said parity bit by using a predetermined conversion rule to limit a number of continuous "1"s smaller than or equal to r bits.

2. The coding apparatus according to claim 1, wherein a number of continuous "1"s in a coded bit stream with parity outputted from said bit converting circuit is always smaller than or equal to r bits.

3. The coding apparatus according to claim 1, wherein said r bits correspond to three (3) bits or four (4) bits.

4. The coding apparatus according to claim 1, wherein said QMTR coding device corresponds to a 16/17 coding device arranged to convert 16-bit data into 17-bit data, and wherein said r bits correspond to three (3) bits.

5. The coding apparatus according to claim 1, wherein said QMTR coding device corresponds to a 24/25 coding device arranged to convert 24-bit data into 25-bit data, and the number of continuous "1"s in a bit stream corresponds to four (4).

6. The coding apparatus according to claim 1, wherein said number of continuous "0"s in a bit stream is limited.

7. The coding apparatus according to claim 1, wherein a continuous length of a catastrophe series in a bit stream is limited.

8. A coding apparatus comprising:

an n/(n+1) coding device for inputting n-bit data, and converting said n-bit data into an (n+1)-bit coded word;

a parity generating circuit for inputting the (n+1)-bit coded word outputted from said, n/(n+1) coding device, forming a block constituted by at least one (n+1)-bit coded word, generating a parity bit with respect to said block, and adding said parity bit to said at least one coded word of said block;

a first bit converting circuit for inputting the coded word with parity outputted from said parity generating circuit, and converting said parity bit, a bit stream of a predetermined number of bits in said coded word immediately before said parity bit and a bit stream of a predetermined number of bits in said coded word immediately after said parity bit by using a predetermined conversion rule to limit a number of continuous "1"s smaller than or equal to r bits; and a second bit converting circuit provided at an output of said n/(n+1) coding device, for converting coded words to limit a number of continuous "1"s between (n+1)-bit coded words smaller than or equal to r bits, if said parity generating circuit generates said parity bit with respect to one block constituted by a plurality of (n+1)-bit coded words.

9. The coding apparatus according to claim 8, wherein said n/(n+1) coding device limits a number of continuous "1"s in an (n+1)-bit coded word smaller than or equal to r bits, and a number of continuous "1"s at both ends of a coded word smaller than or equal to 2 bits.

10. The coding apparatus according to claim 8, wherein said second bit converting circuit performs code conversion with respect to a bit stream between coded words without said parity bit.

11. The coding apparatus according to claim 8, wherein a number of bits in the coded word with parity outputted from said first bit converting circuit is always smaller than or equal to r bits.

12. The coding apparatus according to claim 8, wherein said n corresponds to sixteen (16), and said r corresponds to three (3).

13. The coding apparatus according to claim 8, wherein said n corresponds to twenty four (24), and said r corresponds to four (4).

14. The coding apparatus according to claim 8, wherein, if said first converting circuit converts the coded word with parity, a value of said parity bit is always "0".

15. The coding apparatus according to claim 8, wherein according to said predetermined conversion rule, said first bit converting circuit converts a bit stream expressed by "0001-1-1100", "1001-1-1100", "0101-1-1100", "1101-1-1100", "0001-1-1101", "1001-1-1101", "0101-1-1101", "1101-1-1101", "0011-1-1000", "1011-1-1000", "0011-1-1001", "1011-1-1001", "0011-1-1010", "1011-1-1010", "0011-1-1011", "1011-1-1011", "0011-1-1100", "0011-1-1100", "0011-1-1101", or "1011-1-1101", where said bit stream of a predetermined number of bits in said coded word immediately before said parity bit, said added parity bit and said bit stream of a predetermined number of bits in said coded word immediately after said parity bit are separated by a symbol "-", into a bit stream expressed by either one of "**-0-1110" and "0111-0-**" (* is don't care), where a bit stream of a predetermined number of bits in a coded word immediately before an added parity bit after conversion, the added parity bit after conversion and a bit stream of a predetermined number of bits in a coded word immediately after the added parity bit after conversion are separated by a symbol "-".

16. A coding method comprising the steps of:

inputting n-bit data;

converting the n-bit data into an (n+1)-bit coded word in which a number of continuous "1"s in an (n+1)-bit word is limited to smaller than or equal to r bits, and a number of continuous "1"s at both ends of a coded word is limited to smaller than or equal to 2 bits;

forming at least one (n+1)-bit coded word as one block;

generating a parity bit for error detection with respect to said block;

adding said parity bit to said block;

first bit converting said parity bit, a bit stream of a predetermined number of bits in said coded word immediately before said parity bit and a bit stream of a predetermined number of bits in said coded word immediately after said parity bit to limit a number of continuous "1"s smaller than or equal to r bits, and second bit converting coded words in said n-bit to (n+1)-bit data conversion to limit a number of continuous "1"s between (n+1)-bit coded words smaller than or equal to r bits, if said parity bit is generated with respect to one block constituted by a plurality of (n+1)-bit coded words.

17. The coding method according to claim 16, wherein a number of bits in the coded word with parity outputted in said first bit conversion is always smaller than or equal to r bits.

18. The coding method according to claim 16, wherein said n corresponds to sixteen (16), and said r corresponds to (3).

19. The coding method according to claim 16, wherein said n corresponds to twenty four (24), and said r corresponds to four (4).

20. The coding method according to claim 16, wherein, if the coded word with parity is converted in said first bit conversion, a value of said parity bit is always "0".

21. The coding method according to claim 16, wherein said first bit conversion is performed according to a predetermined conversion rule in that, where said bit stream of a predetermined number of bits in said coded word immediately before said parity bit, said added parity bit and said bit stream of a predetermined number of bits in said coded word immediately after said parity bit are separated by a symbol "-", a bit stream expressed by "0001-1-1100", "1001-1-1100", "0101-1-1100", "1101-1-1100", "0001-1-1101", "1001-1-1101", "0101-1-1101", "1101-1-1101", "0011-1-1000", "1011-1-1000", "0011-1-1001", "1011-1-1001", "0011-1-1010", "1011-1-1010", "0011-1-1011", "1011-1-1011", "0011-1-1100", "1011-1-1100", "0011-1-1101", or "1011-1-1101", is converted into a bit stream expressed by either one of "**-0-1110" and "0111-0-**" (* is don'tcare), where a bit stream of a predetermined number of bits in a coded word immediately before an added parity bit after conversion, the added parity bit after conversion and a bit stream of a predetermined number of bits in a coded word immediately after the added parity bit after conversion are separated by a symbol "-".

* * * * *